(12) United States Patent
Sun et al.

(10) Patent No.: US 12,408,293 B2
(45) Date of Patent: Sep. 2, 2025

(54) FOLDABLE ELECTRONIC DEVICE

(71) Applicant: Acer Incorporated, New Taipei (TW)

(72) Inventors: Hui-Ping Sun, New Taipei (TW);
Jui-Yi Yu, New Taipei (TW);
Chun-Hung Wen, New Taipei (TW);
Yen-Chou Chueh, New Taipei (TW);
Yu-Ming Lin, New Taipei (TW);
Chun-Hsien Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 278 days.

(21) Appl. No.: 18/354,676

(22) Filed: Jul. 19, 2023

(65) Prior Publication Data
US 2024/0098932 A1 Mar. 21, 2024

(30) Foreign Application Priority Data
Sep. 16, 2022 (TW) ................................. 111135238

(51) Int. Cl.
*H05K 7/20* (2006.01)
*G06F 1/16* (2006.01)
*G06F 1/20* (2006.01)

(52) U.S. Cl.
CPC ....... *H05K 7/20154* (2013.01); *G06F 1/1616* (2013.01); *G06F 1/1681* (2013.01); *G06F 1/203* (2013.01); *H05K 7/2039* (2013.01); *G06F 2200/202* (2013.01)

(58) Field of Classification Search
CPC .............. G06F 1/1616; G06F 1/1681; G06F 2200/202; G06F 1/166; G06F 1/1637; G06F 1/1679; G06F 1/183; G06F 1/206; G06F 2200/203; G06F 1/203; H05K 7/20145; H05K 7/20136; H05K 7/20154; H05K 7/2039; F28D 15/0233; H04M 1/022
See application file for complete search history.

(56) References Cited

U.S. PATENT DOCUMENTS

| | | | |
|---|---|---|---|
| 2004/0042176 A1* | 3/2004 | Niwatsukino | F28D 15/0266 165/80.4 |
| 2005/0111183 A1* | 5/2005 | Pokharna | G06F 1/206 361/679.48 |
| 2009/0147469 A1* | 6/2009 | Chen | G06F 1/166 361/679.55 |
| 2018/0173282 A1* | 6/2018 | Huang | H01L 23/427 |
| 2021/0356999 A1* | 11/2021 | Chao | H05K 7/20145 |

* cited by examiner

*Primary Examiner* — Michael A Matey
(74) *Attorney, Agent, or Firm* — JCIPRNET (57) ABSTRACT

A foldable electronic device, including a first body, a second body, an air valve movably disposed in the first body, at least one triggering member, and a hinge connecting the first body and the second body, is provided. The first body has multiple openings respectively located at two opposite surfaces. The triggering member is movably disposed in the first body and has a part exposed outside the first body. The air valve and the triggering member are mutually on moving paths of each other. The first body and the second body are rotated to be folded or unfolded relative to each other by the hinge. A part of the triggering member is suitable for bearing a force such that the triggering member drives the air valve, so that the air valve opens or closes the openings.

16 Claims, 13 Drawing Sheets

FOLDABLE ELECTRONIC DEVICE

CROSS-REFERENCE TO RELATED APPLICATION

This application claims the priority benefit of Taiwan application serial no. 111135238, filed on Sep. 16, 2022. The entirety of the above-mentioned patent application is hereby incorporated by reference herein and made a part of this specification.

BACKGROUND

Technical Field

The disclosure relates to a foldable electronic device.

Description of Related Art

A notebook computer includes a keyboard and a screen. Generally speaking, the keyboard is equipped with a central processing unit. The central processing unit generates a large amount of heat, which will cause the electronic elements inside the keyboard to fail. Therefore, how to effectively dissipate the heat of the central processing unit to the outside is one of the goals of industries in the art.

At the same time, in order to comply with the ergonomics during operation, most of the conventional notebook computers support the screen on the desktop and partially lift the host after unfolding the screen relative to the host, so that the inclined host and the keyboard and the touchpad on the inclined surface can facilitate the tapping action of the user, which will not cause fatigue in a short time in addition to maintaining the input feel. Furthermore, the elevated host can be used as a source of cool air from the bottom when the fan therein is operating, thereby helping to improve the heat dissipation efficiency of heat dissipation components such as the fan.

However, after supporting and elevating the host with the screen, a part of the screen is covered by the host (from the viewing angle of the user), and the rear side of the host originally as the airflow outlet of the fan also directly faces the screen, which are factors not conducive to vision (the screen-to-body ratio of the screen) and heat dissipation.

SUMMARY

The disclosure provides a foldable electronic device, which provides a movable air valve in one of the bodies thereof to provide an additional escape path for an airflow discharged by another body.

The foldable electronic device of the disclosure includes a first body, a second body, an air valve, at least one triggering member, and a hinge. The first body has multiple openings, which are respectively located at two opposite surfaces of the first body. The air valve is movably disposed in the first body. The triggering member is movably disposed in the first body and has a part exposed outside the first body, and the triggering member and the air valve are mutually on moving paths of each other. The hinge connects the first body and the second body, so that the first body and the second body are rotated to be folded or unfolded relative to each other by the hinge. A part of the triggering member is suitable for bearing a force such that the triggering member drives the air valve, so that the air valve opens or closes the openings.

Based on the above, the body of the foldable electronic device is further provided with the movable triggering member and air valve, the triggering member has a part exposed outside the body to bear the force, and the triggering member and the air valve are mutually on the moving paths of each other. Therefore, the air valve can provide the functions of opening and closing the openings of the body, that is, the user can change the position of the air valve in the body by driving the triggering member, thereby operating the air valve to open and close the openings. The changes of the above mechanism are adapted to the specific functions required by the foldable electronic device.

DETAILED DESCRIPTION OF DISCLOSED EMBODIMENTS

Figure 1A:
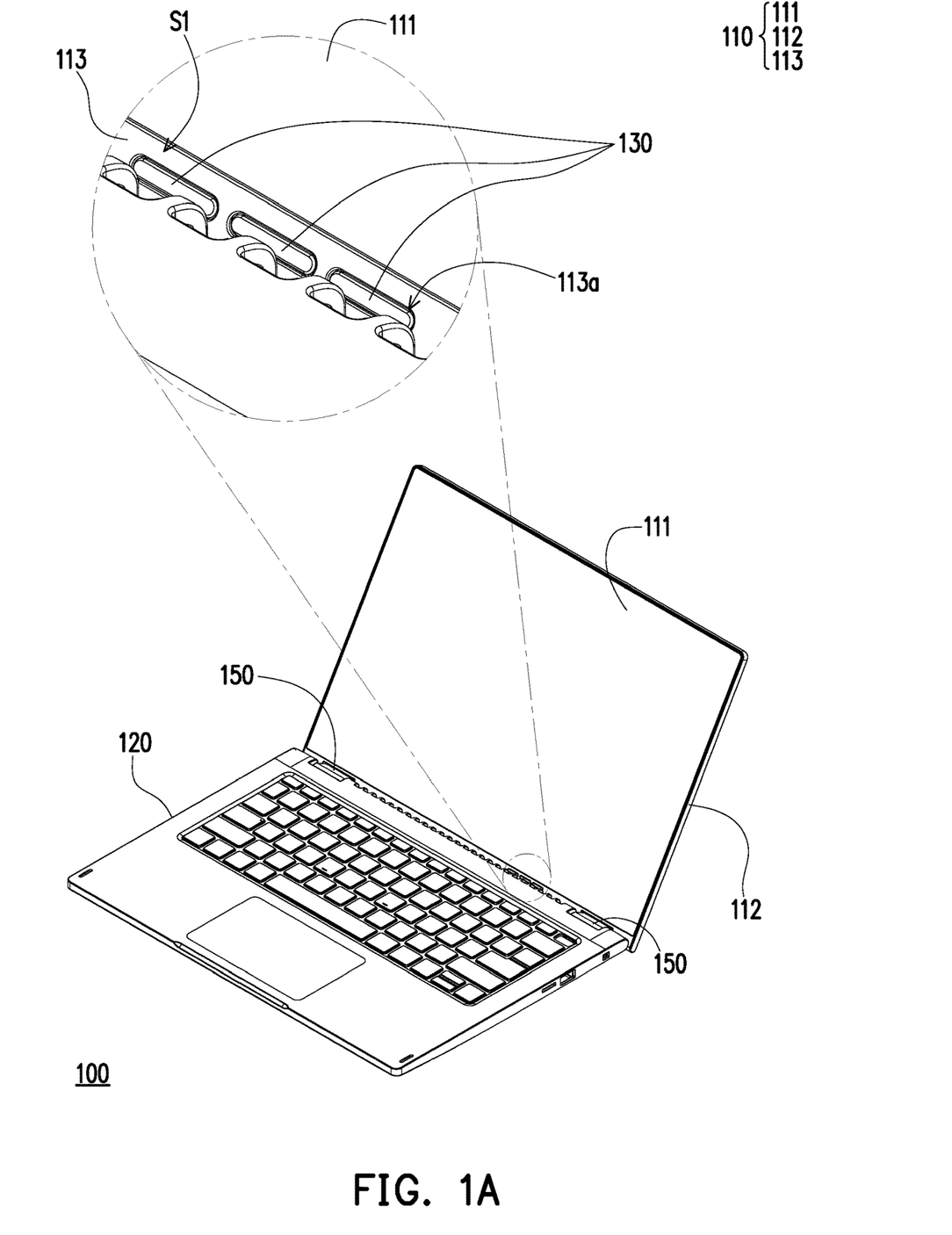
FIG. 1A is a schematic view of a foldable electronic device according to an embodiment of the disclosure.
Figure 1B:
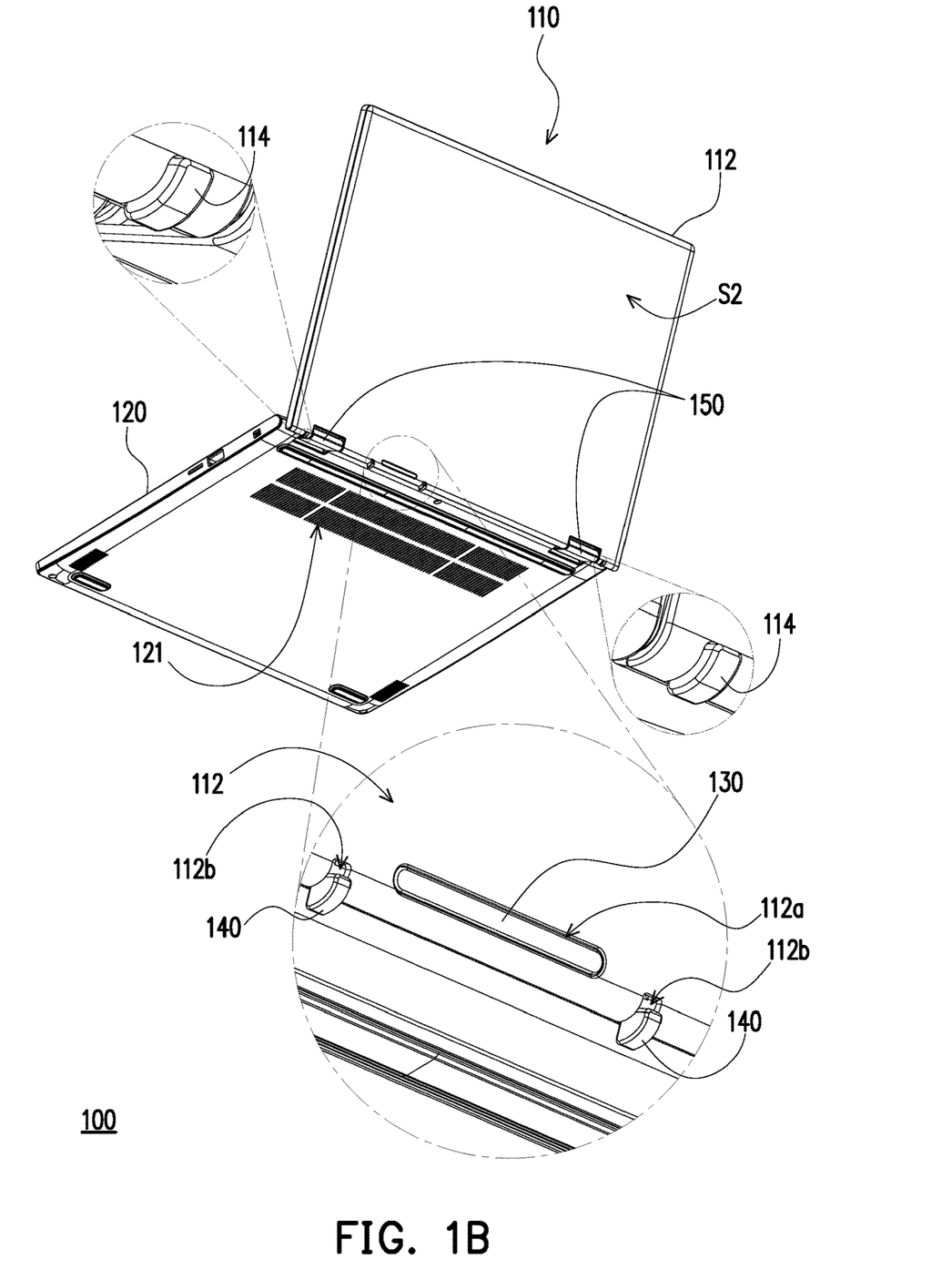
FIG. 1B illustrates the foldable electronic device of FIG. 1A from another viewing angle.

FIG. 1A is a schematic view of a foldable electronic device according to an embodiment of the disclosure. FIG. 1B illustrates the foldable electronic device of FIG. 1A from another viewing angle. Taking a notebook computer as an example, a foldable electronic device 100 includes a first body 110, a second body 120, and a hinge 150, wherein the hinge 150 connects the first body 110 and the second body 120, so that the first body 110 and the second body 120 are rotated to be folded or unfolded relative to each other by the hinge 150. Here, FIG. 1A and FIG. 1B show the foldable electronic device 100 in an unfolded state.

Figure 2A:
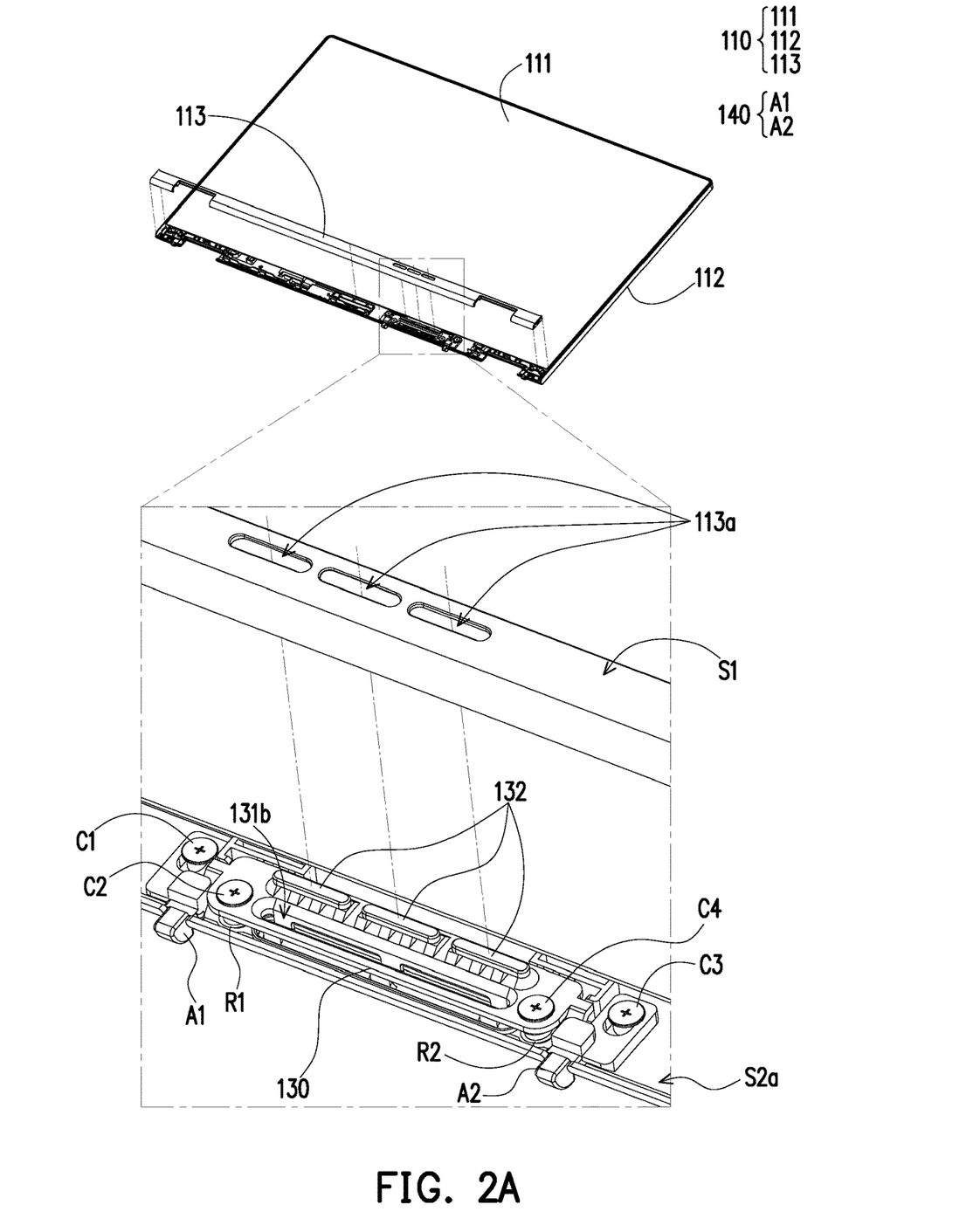
FIG. 2A is a disassembled schematic view of some components of the foldable electronic device of FIG. 1A.
Figure 2B:
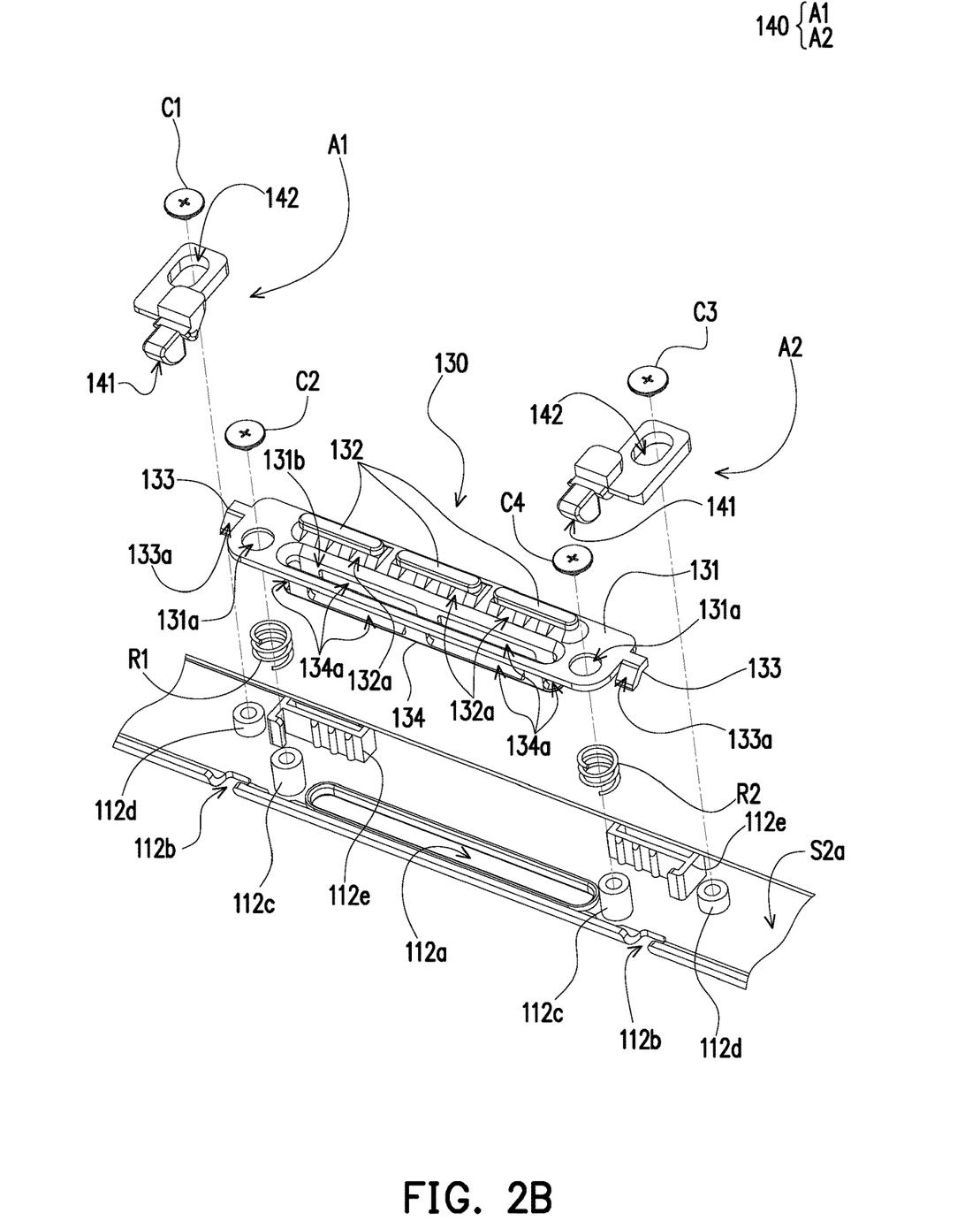
FIG. 2B further illustrates a disassembly situation of some components of FIG. 2A.
Figure 2C:
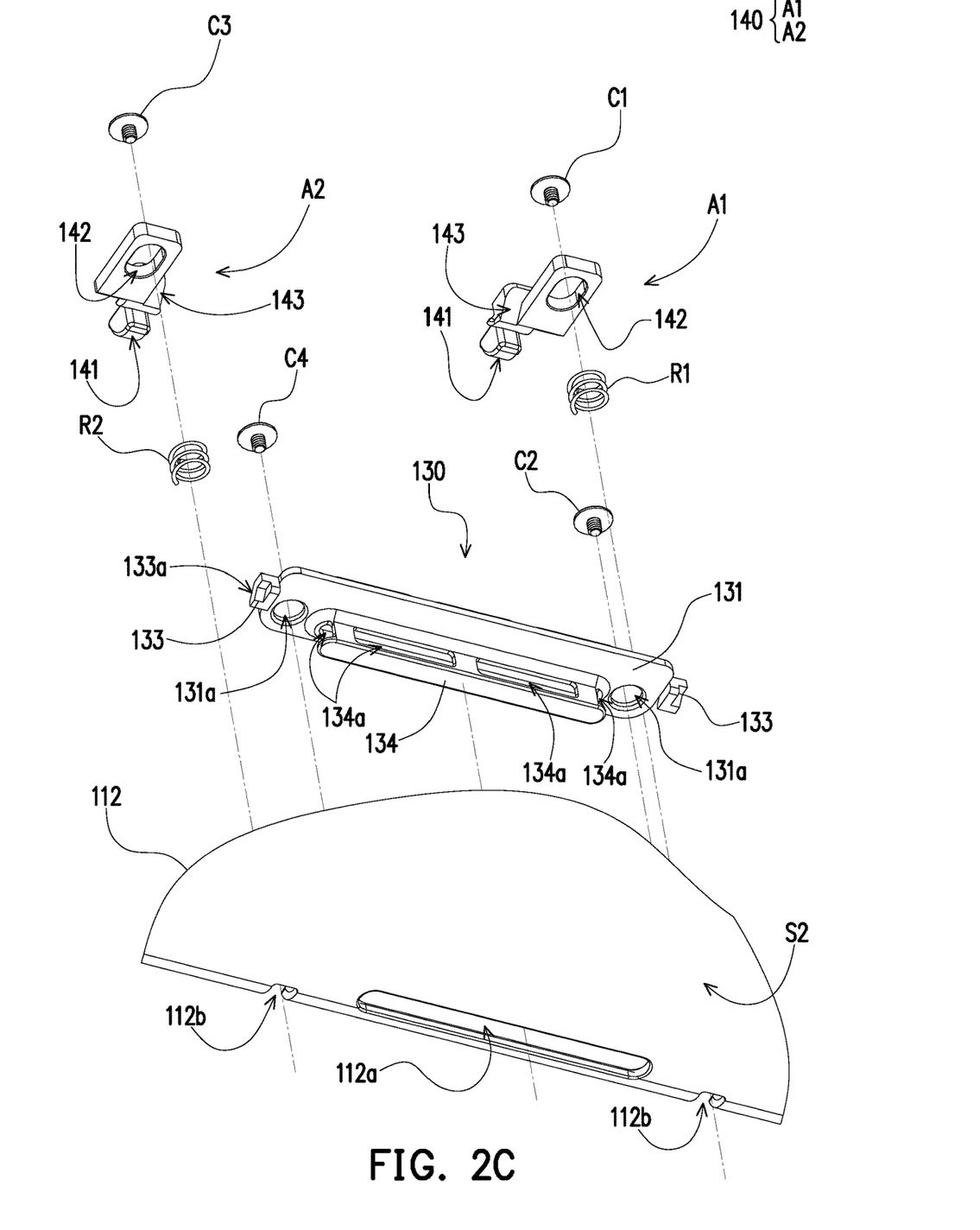
FIG. 2C illustrates related components of FIG. 2B from another viewing angle.
Figure 2D:
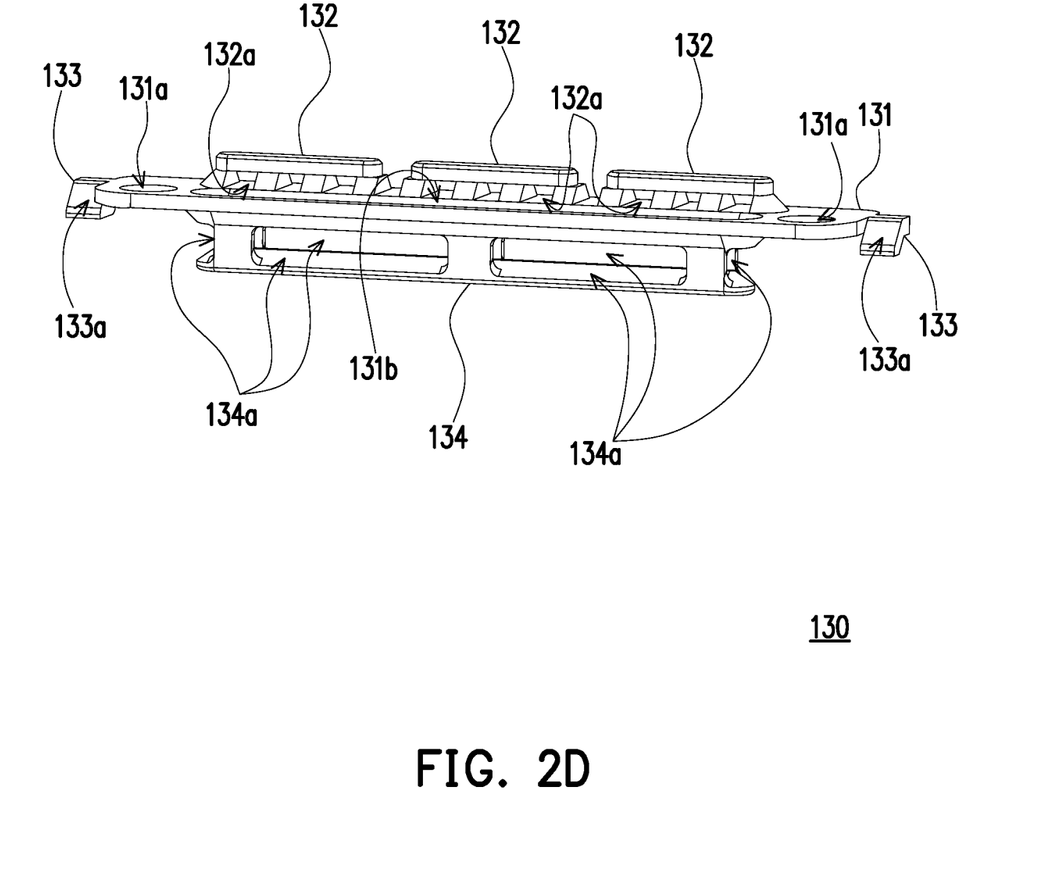
FIG. 2D is a schematic view of an air valve according to an embodiment of the disclosure.

FIG. 2A is a disassembled schematic view of some components of the foldable electronic device of FIG. 1A. FIG. 2B further illustrates a disassembly situation of some components of FIG. 2A. FIG. 2C illustrates related components of FIG. 2B from another viewing angle. FIG. 2D is a schematic view of an air valve according to an embodiment of the disclosure. Please refer to FIG. 2A to FIG. 2C first. In the embodiment, the foldable electronic device 100 further includes an air valve 130 and at least one triggering member 140. Here, the triggering member 140 including two parts A1 and A2 is taken as an example. The air valve 130 is movably disposed in the first body 110. The triggering member 140 is movably disposed in the first body 110 and has a part exposed outside the first body 110, and the triggering member 140 and the air valve 130 are mutually on moving paths of each other. Furthermore, the first body 110 of the embodiment includes a display module 111, a front cover 113, and a back cover 112, which are assembled with each other. Please refer to FIG. 1A and FIG. 1B, it can be seen that the display module 111 is stacked on a part of the back cover 112, the display module 111 and a front surface S1 of the front cover 113 are substantially on the same plane, and the front cover 113 is stacked on another part of the back cover 112. In other words, when the first body 110 is folded to the second body 120, the display module 111 and the front cover 113 face the second body 120, and the back cover 112 faces away from the second body 120. Multiple openings being respectively located at two opposite surfaces of the first body 110 refers to the front surface S1 and a rear surface S2 of the back cover 112.

In addition, please refer to FIG. 1A and FIG. 1B again. The first body 110 of the embodiment also has multiple openings, which are respectively located at the front cover 113 and the back cover 112. Here, the opening located at the front cover 113 is defined as a first opening 113a, and the opening located at the back cover 112 is defined as a second opening 112a. Meanwhile, the embodiment takes three first openings 113a and one second opening 112a as an example, but not limited thereto. Meanwhile, it can be clearly seen from the correspondence between the front cover 113 and the back cover 112 that the first opening 113a and the second opening 112a are communicated with each other through an inner space of the first body 110. More importantly, the movable air valve 130 is a component that can open or close the first openings 113a and the second openings 112a, and the triggering member 140 is disposed at a junction between the front cover 113 and the back cover 112 and is exposed from the first body 110, so as to bear a force to drive the air valve 130, which will be further described later.

Please refer to FIG. 2B to FIG. 2D first, and compare with FIG. 2A or FIG. 1B to facilitate understanding of the configuration relationship of the related components. In the embodiment, the back cover 112 also has a guide post 112d, a guide post 112c, and a limiting portion 112e located on an inner surface S2a. The second opening 112a connects the inner surface S2a and the rear surface S2 (labelled in FIG. 1B) of the back cover 112, and the back cover 112 also has a notch 112b for the triggering member 140 to pass through. The notch 112b is adjacently connected between the inner surface S2a and the rear surface S2.

As shown in FIG. 2D, the air valve 130 has a plate body 131, multiple stopping portions, and two side wings 133, wherein the plate body 131 has openings 131a and 131b, the stopping portions are located at two opposite surfaces of the plate body 131 and are distinguished as multiple first stopping portions 132 and one second stopping portion 134 here, and the first stopping portion 132 and the second stopping portion 134 are respectively spaced apart relative to the plate body 131 to form multiple (lattice or grid) channels 132a and 134a. The first stopping portion 132, the second stopping portion 134, and the opening 131b are side by side, and the channels 132a and 134a are located between the two side wings 133 or are located between the two openings 131a.

Next, please refer to FIG. 2B and FIG. 2C again. The foldable electronic device 100 of the embodiment further includes springs R1 and R2 and multiple locking members C1, C2, C3, and C4, wherein the air valve 130 is sleeved onto the guide post 112c to be movable up and down (for example, from the viewing angle shown in FIG. 2B) through the opening 131a. The springs R1 and R2 are respectively sleeved onto the guide post 112c and thus abut between the inner surface S2a of the back cover 112 and the air valve 130. Finally, the locking members C2 and C4 are respectively locked to the guide post 112c to stop the up and down movements of the air valve 130. Furthermore, the triggering member 140 of the embodiment includes two parts A1 and A2, which respectively have an expanded hole 142 to be movably sleeved onto the guide post 112d. For FIG. 2B, the triggering member 140 is in a state of being movable along the lower left and the upper right. Similarly, the locking members C1 and C3 are locked to the guide post 112d to stop and limit the triggering member 140, so as to facilitate the movable state of the triggering member 140 on the inner surface S2a.

In addition, as shown in FIG. 2A and FIG. 2B, the limiting member 112e (labeled in FIG. 2B) limits the air valve 130 to smoothly move up and down along the guide post 112c through a rib structure thereof, so as to move closer to or away from the inner surface S2a of the back cover 112.

The assembled air valve 130, triggering member 140, and first body 110 are as shown in FIG. 1A and FIG. 1B. The first stopping portion 132 corresponds to the first opening 113a to open and close the first opening 113a, and the second stopping portion 134 corresponds to the second opening 112a to open and close the second opening 112a.

Figure 3A:
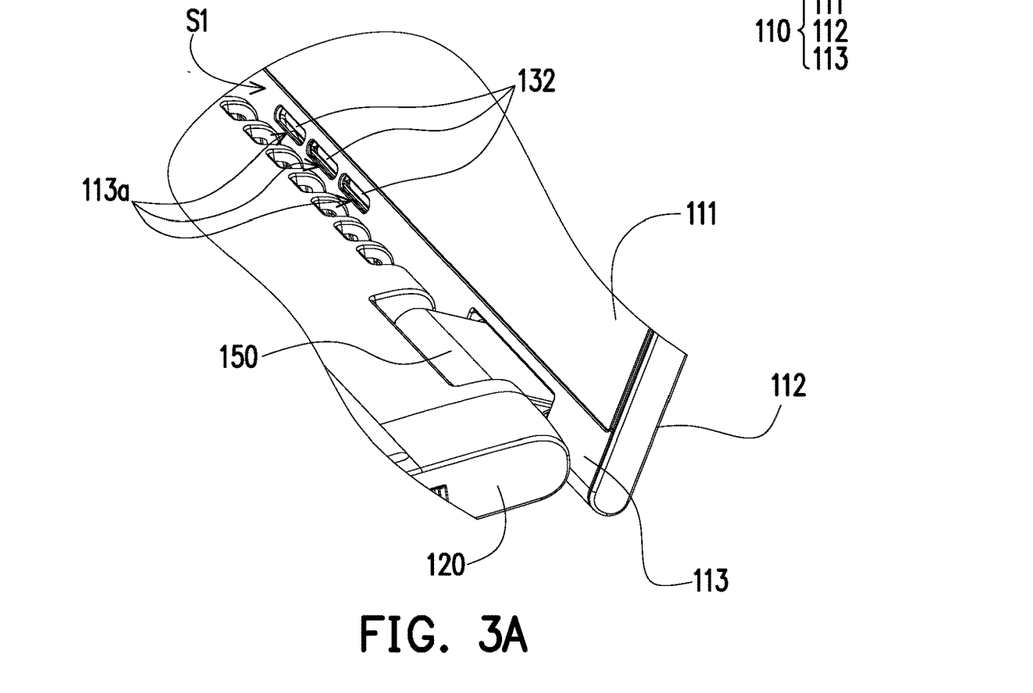
FIG. 3A and FIG. 3B partially illustrate a state of a foldable electronic device with an air valve opening openings from different viewing angles.
Figure 3B:
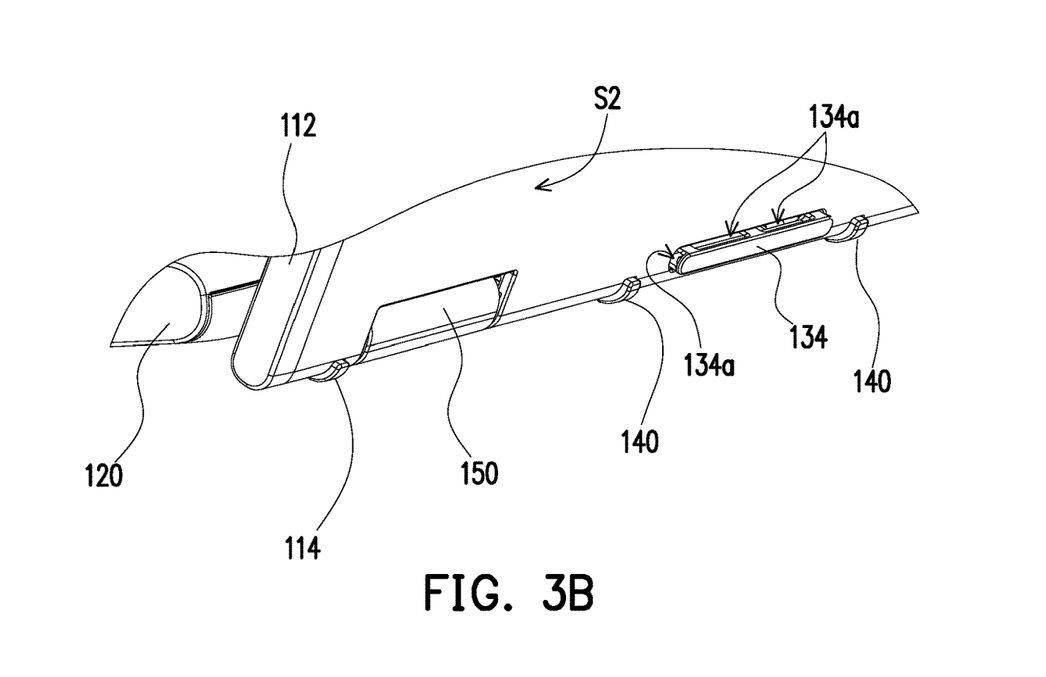
Figure 4:
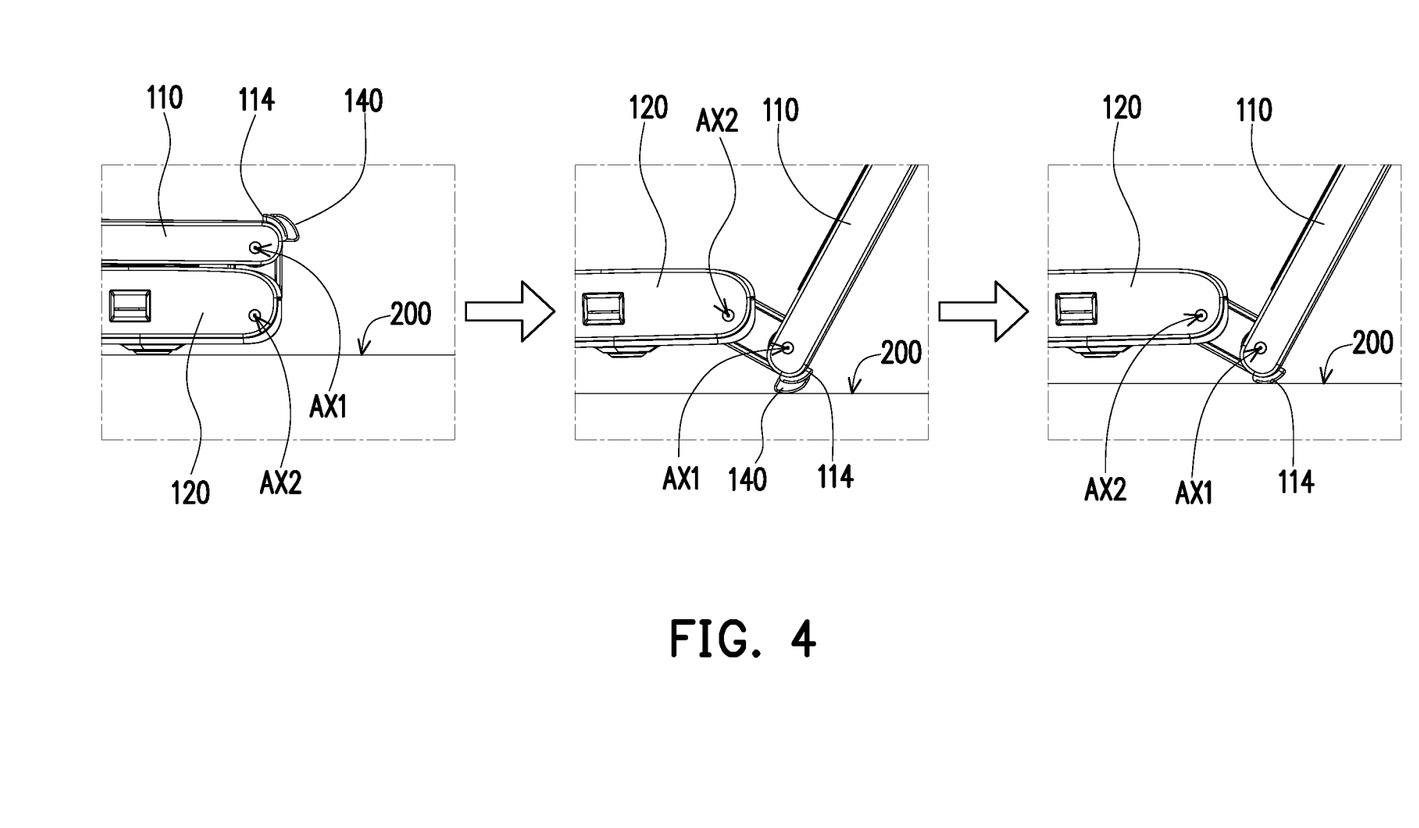
FIG. 4 partially illustrates different states of a foldable electronic device from a side viewing angle.
Figure 5A:
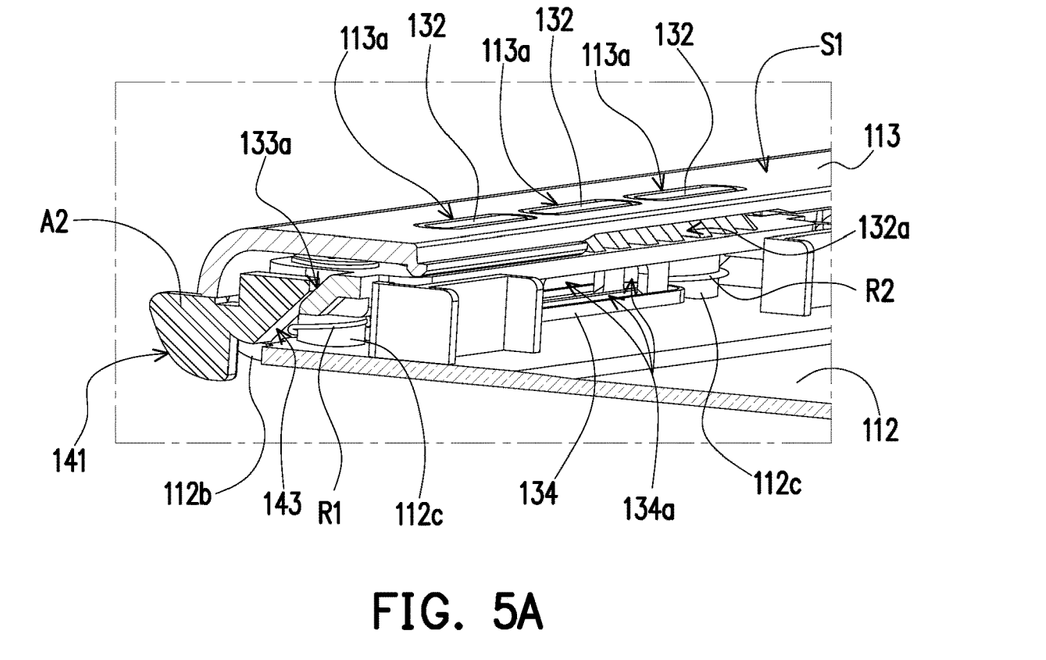
FIG. 5A and FIG. 5B are partial cross-sectional views of an air valve closing openings.
Figure 5B:
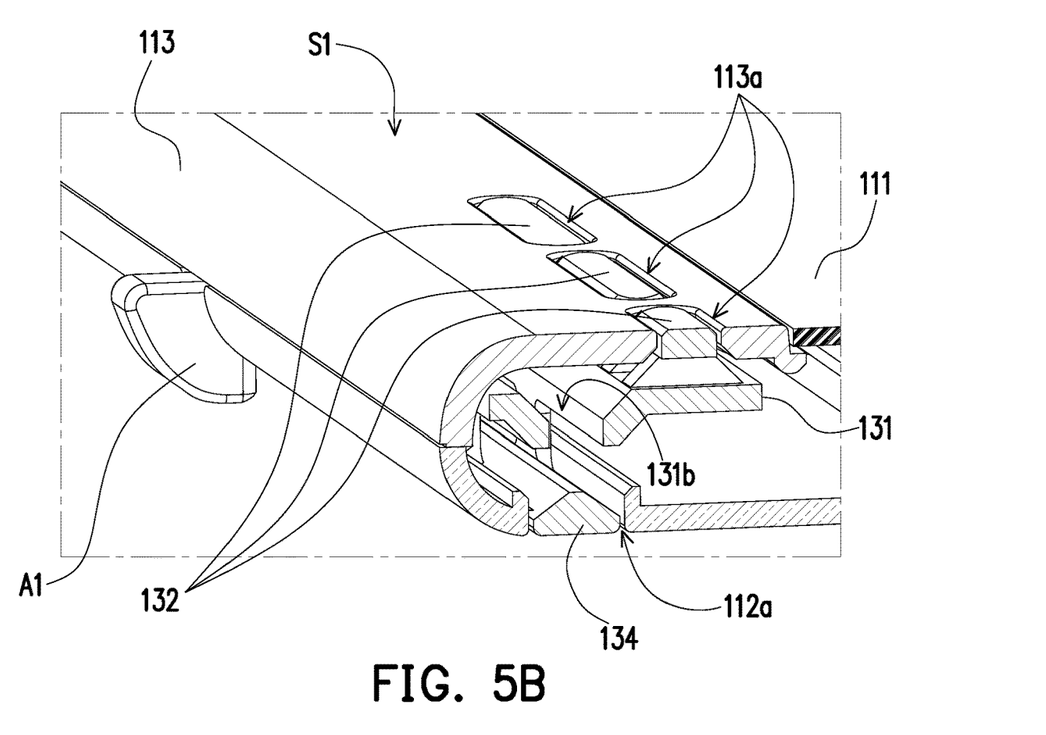
Figure 5C:
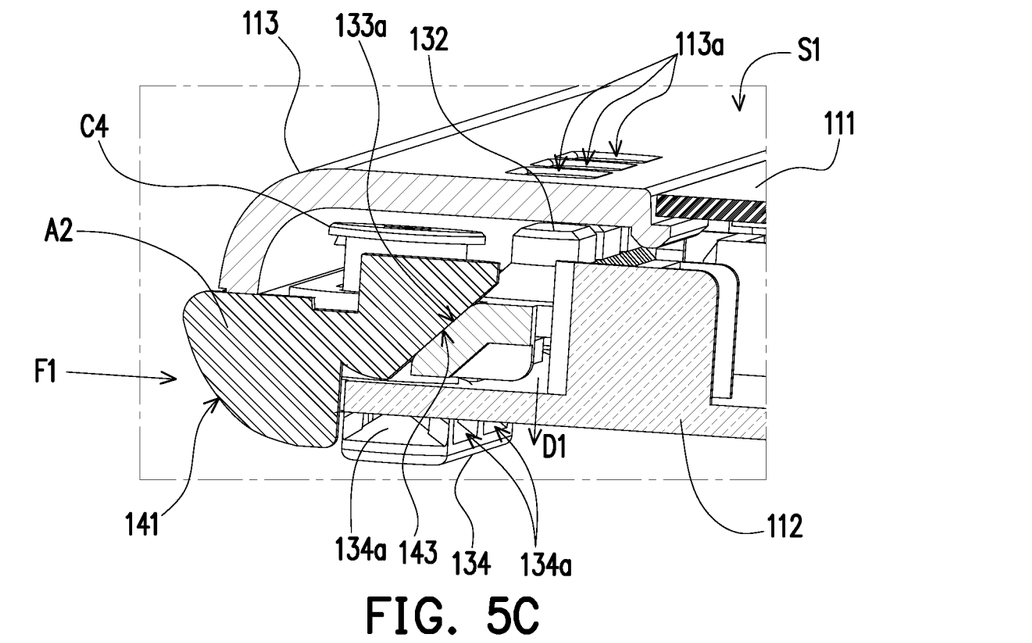
FIG. 5C and FIG. 5D are partial cross-sectional views of an air valve opening openings.
Figure 5D:
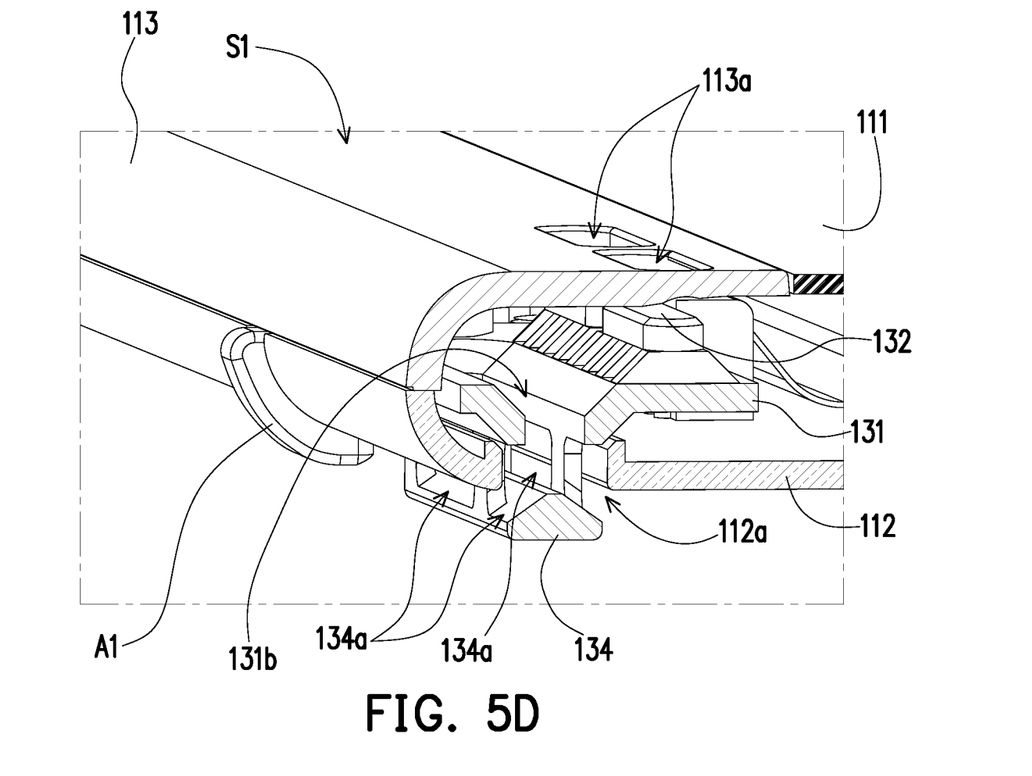

FIG. 3A and FIG. 3B partially illustrate a state of a foldable electronic device with an air valve opening openings from different viewing angles. FIG. 4 partially illustrates different states of a foldable electronic device from a side viewing angle. FIG. 5A and FIG. 5B are partial cross-sectional views of an air valve closing openings. FIG. 5C and FIG. 5D are partial cross-sectional views of an air valve opening openings. Please refer to FIG. 3A and FIG. 3B first, and compare FIG. 1A and FIG. 1B. Because of the configuration of the related components, the triggering member 140 can smoothly generate a linkage relationship with the air valve 130 to open or close the first opening 113a and the second opening 112a, so that the first body 110 generates a linkage relationship from the first opening 113a, the inner space of the first body 110, and the second opening 112a. As shown in FIG. 3A and FIG. 3B, the first stopping portion 132 of the air valve 130 is embedded into the first body 110 from the first opening 113a, and the second stopping portion 134 protrudes from the rear surface S2 of the back cover 112 from the second opening 112a, so that the channel 134a is exposed outside the first body 110.

Next, please refer to FIG. 4. Here, one of the manners for driving the triggering member 140 is provided, but not limited thereto. As shown in FIG. 4, the foldable electronic device 100 is suitable for being placed on a platform 200 (for example, a desktop), and when the user unfolds the first body 110 (for example, a screen) relative to the second body 120 (for example, a host), the triggering member 140 can abut against the platform 200.

Please refer to FIG. 1B and FIG. 4 at the same time. In the embodiment, the first body 110 also has at least one supporting portion (here, two supporting portions 114 are taken as an example, which may be regarded as two of the foot pads of the foldable electronic device 100, but not limited thereto), the supporting portion 114 and the triggering member 140 are both located and both protrude from the edge of the first body 110, so that when the first body 110 is unfolded relative to the second body 120 as shown in the center drawing of FIG. 4, the supporting portion 114 and the triggering member 140 are both located at the bottom of the first body 110 to successively rely on the platform 200. Here, the height of a part of the triggering member 140 protruding from the edge is greater than the height of the supporting portion 114 protruding from the edge, wherein the height of the supporting portion 114 protruding from the edge is a fixed value, so at this time, the first body 110 abuts against the platform 200 with an abutment surface 141 of the triggering member 140. Next, as shown in the right drawing of FIG. 4, in order to open the openings (the first opening 113a and the second opening 112a), the user may apply a force to the first body 110 to push the first body 110 down toward the direction of the platform 200, so as to drive (trigger) the triggering member 140 to move toward the inner space of the first body 110 until the height of the part of the triggering member 140 protruding from the edge is equal to the height of the supporting portion 114 protruding from the edge. In other words, when the triggering member 140 has driven the air valve 130 to open the first opening 113a and the second opening 112a, the heights of the supporting portion 114 and the triggering member 140 protruding relative to the first body 110 are the same, that is at this time, the first body 110 is supported on the platform 200 by the supporting portion 114 and the triggering member 140.

Please refer to FIG. 5A to FIG. 5D at the same time. Here, cross-sectional views at different places are used to illustrate the linkage relationship between the triggering member 140 and the air valve 130 of the embodiment, wherein FIG. 5A and FIG. 5B correspond to FIG. 1A and FIG. 1B, that is, the state of the air valve 130 closing the openings, while FIG. 5C and FIG. 5D illustrate the state of the air valve 130 opening the openings. As shown in FIG. 5A and FIG. 5C (or may also refer to FIG. 2B and FIG. 2C at the same time), the air valve 130 and the triggering member 140 achieve the required movements by corresponding structures of wedge surfaces. Here, the triggering member 140 has a wedge surface 143, the two side wings 133 of the air valve 130 also have a corresponding wedge surface 133a, and the wedge surfaces 143 and 133a are movably abutted together.

Accordingly, as shown in FIG. 5C, when the triggering member 140 moves toward the inner space of the first body 110 due to a force F1 on the abutment surface 141, during the process from FIG. 5C to FIG. 5A, the air valve 130 can be driven by the wedge surfaces 143 and 133a to move along the direction D1, which is equivalent to moving the air valve 130 from the front cover 113 toward the back cover 112.

In this way, the first stopping portion 132 can be further embedded into the first body 110 (the first stopping portion 132 being embedded into the first opening 113a of the front cover 113 is also equivalent to moving the first stopping portion 132 from the first opening 113a toward the back cover 112). The second stopping portion 134 protrudes from the first body 110 (the second stopping portion 134 protruding from the second opening 112a of the back cover 112 is also equivalent to moving the second stopping portion 134 away from the front cover 113 from the second opening 112a and is also equivalent to moving away from the rear surface S2 of the back cover 112), so that the first body 110 transitions from the opening closed state shown in FIG. 5B to the opening open state shown in FIG. 5D.

Figure 6A:
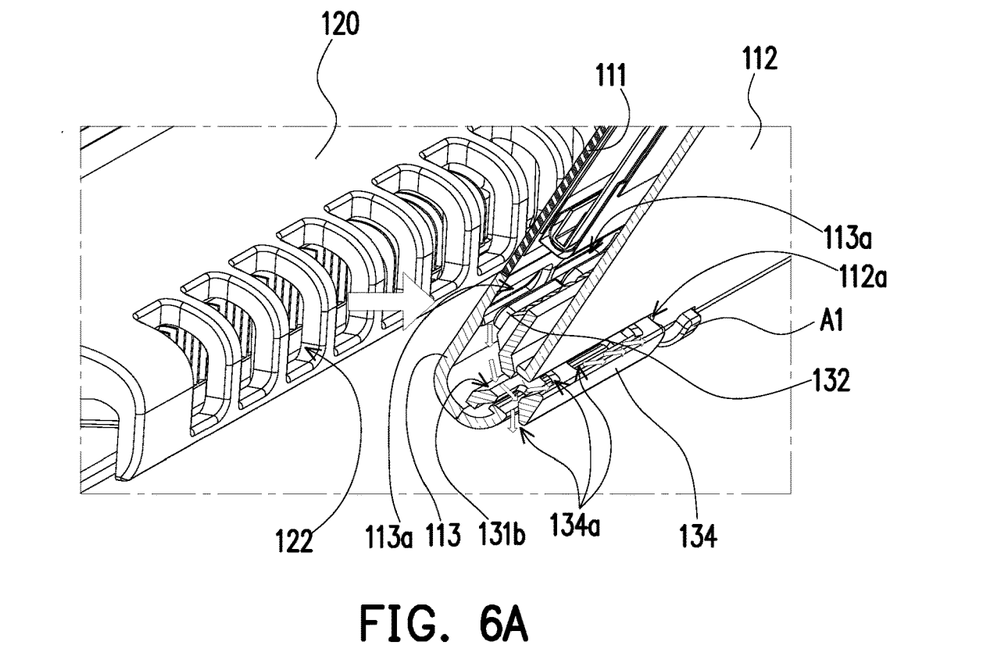
FIG. 6A and FIG. 6B are schematic views of some components of a foldable electronic device.
Figure 6B:
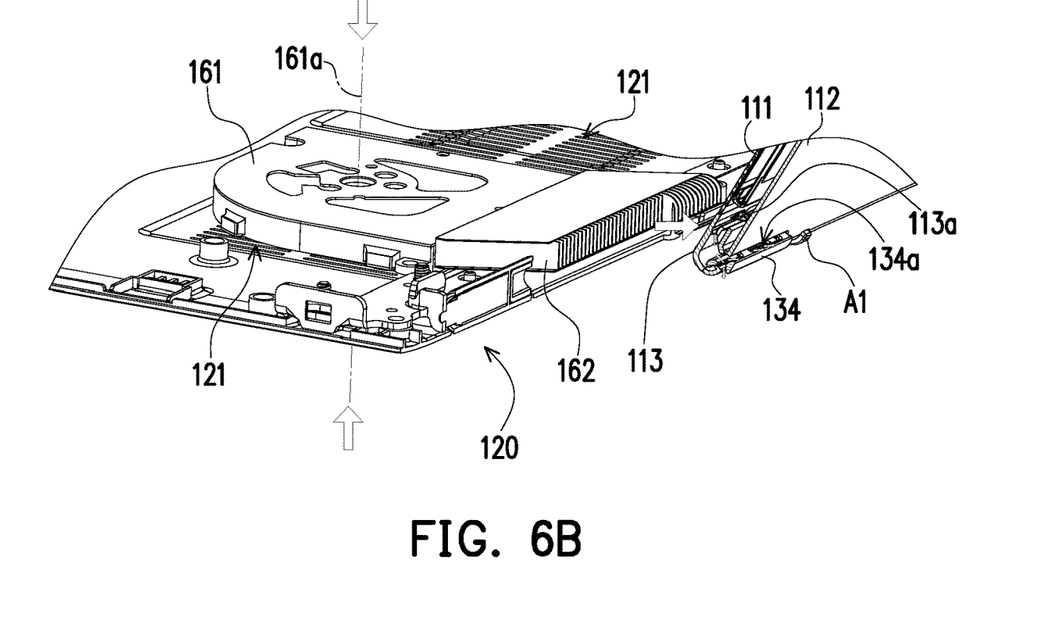

FIG. 6A and FIG. 6B are schematic views of some components of a foldable electronic device. Please refer to FIG. 6A and FIG. 6B at the same time. In the embodiment, the foldable electronic device 100 further includes a centrifugal fan 161 and a heat dissipation fin 162. The centrifugal fan 161 is suitable for introducing cool air from the external environment into the centrifugal fan 161 from an axial direction 161a thereof to generate an airflow, which passes through the heat dissipation fin 162 to absorb heat (for example, through a bottom opening 121 of the second body 120), and is then discharged through a lateral opening 122 of the second body 120. However, as described above or as shown in FIG. 4, since the first body 110 partially blocks the second body 120 after being unfolded relative to the second body 120 to open the openings by the linkage relationship between the triggering member 140 and the air valve 130 of the embodiment, as shown in FIG. 6A and FIG. 6B, the airflow discharged from the lateral opening 122 can at least partially pass through the first body 110 due to the opening of the openings.

For example, when the openings need to be further opened, as shown in the center drawing and the right drawing of FIG. 4, the user pushes the first body 110 down to drive the triggering member 140, so that at least part of the airflow discharged from the second body 120 can be discharged from the rear surface S2 of the back cover 112 from the first opening 113a, the opening 131b, the second opening 112a, and the channels 132a and 134a as shown in FIG. 6A and FIG. 6B, so as to provide an additional escape path for the airflow discharged from the second body 120.

Please refer to FIG. 4 again. In actual use, whether the triggering member 140 is trigged may be based on the self-weight of the first body 110, that is, as shown in the center drawing of FIG. 4. When the user unfolds the first body 110 such that the triggering member 140 abuts against the platform 200, the above triggering action can be successively activated. Of course, in other unshown embodiments, a tenon structure or a latch structure may also be used to activate, maintain, or deactivate the triggering state of the triggering member 140.

Figure 7A:
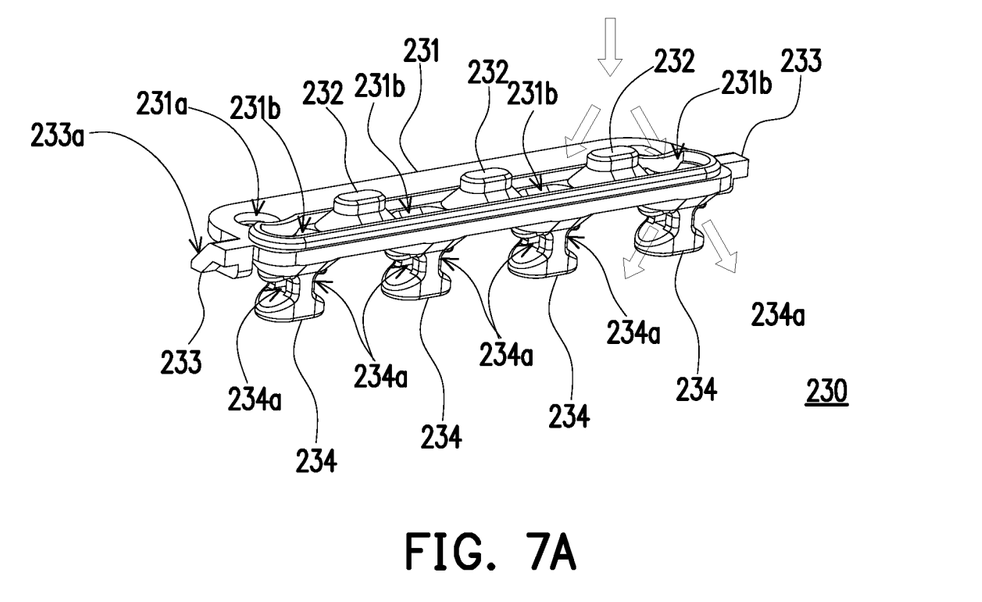
FIG. 7A and FIG. 7B illustrate an air valve according to another embodiment from different viewing angles.
Figure 7B:
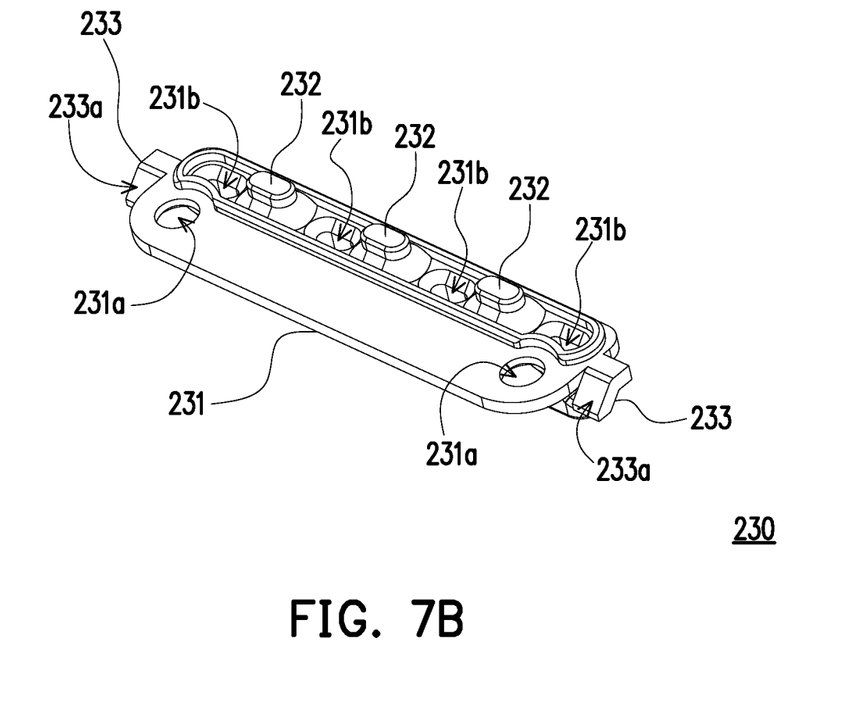
Figure 8A:
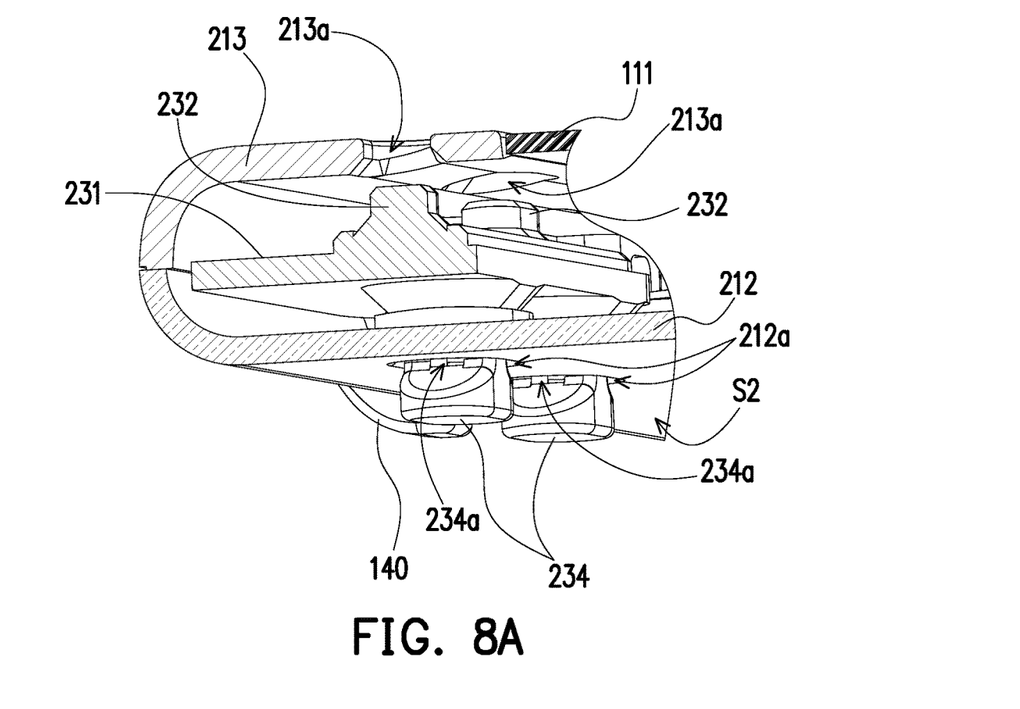
FIG. 8A and FIG. 8B are partial cross-sectional views of an air valve opening openings from different viewing angles.
Figure 8B:
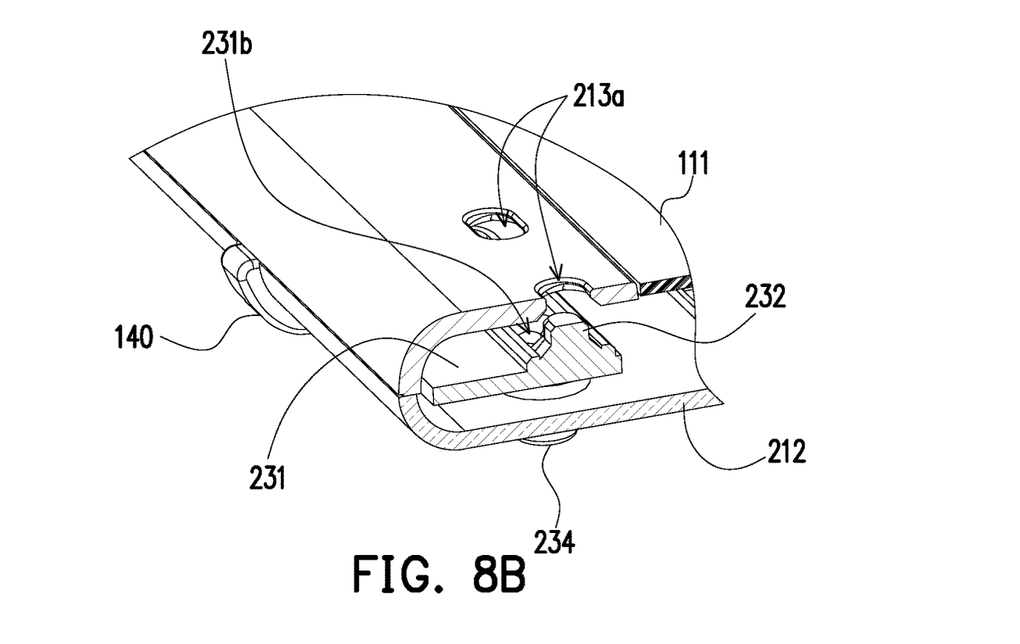

FIG. 7A and FIG. 7B illustrate an air valve according to another embodiment from different viewing angles. FIG. 8A and FIG. 8B are partial cross-sectional views of an air valve opening openings from different viewing angles. Please refer to FIG. 7A, FIG. 7B, FIG. 8A, and FIG. 8B at the same time. In the embodiment, only an air valve 230 is different from the air valve 130 of the foregoing embodiments, and other features such as peripheral components and driving relationships are the same as the foregoing embodiments, so the same content will not be repeated.

Please refer to FIG. 7A and FIG. 7B, and compare with FIG. 2D of the foregoing embodiment. The air valve 230 of the embodiment includes a plate body 231, multiple first stopping portions 232, a pair of wing portions 233, and multiple second stopping portions 234, wherein the plate body 231 has multiple openings 231a and 231b, the first stopping portions 232 bulge from the plate body 231, and the first stopping portions 232 and the openings 231b are located in the same row and staggered. Here, the wing portion 233 and a wedge surface 233a thereof are the same as the foregoing embodiments and are driven by the triggering member 140, so the triggering member 140 will not be illustrated and described here. Similarly, the opening 231a is also the same as the opening 131a of the foregoing embodiments and is used for screws C2 and C4 to pass through to lock the air valve 230 to the structure, so there will also be no repetition. In short, the driving manner and related components of the air valve 230 of the embodiment are still the same as the air valve 130 of the foregoing embodiments.

Furthermore, the second stopping portion portions 234 and the first stopping portions 232 are opposite to each other across the plate body 231. Further, each second stopping portion 234 also bulges relative to the plate body 231, and a channel 234a is further formed, so as to be communicated with the opening 231b.

Accordingly, when the triggering member 140 is triggered to drive the first stopping portion 232 and the second stopping portion 234 of the air valve 230 to respectively move away from a corresponding first opening 213a of a front cover 213 and second opening 212a of a back cover 212, that is, a channel for an airflow to pass through can be generated as in the foregoing embodiments. Here, in order to facilitate identification, the airflow is shown in FIG. 7A with arrows. Please refer to FIG. 7A and FIG. 8A at the same time. The uppermost arrow represents the airflow flowing from the first opening 213a into the first body 110. It can be clearly seen that the airflow is separated by the first stopping portion 232 and flows from the adjacent opening 231b to the channel 234a, and the same opening 231b corresponds to two branched channels 234a (of the same second stopping portion 234), so as to increase the number of airflow outlets to be beneficial to heat dissipation.

In summary, in the foregoing embodiments of the disclosure, the body of the foldable electronic device is further provided with the movable triggering member and air valve, the triggering member has a part exposed outside the body to facilitate bearing of a force, and the triggering member and the air valve are mutually on the moving paths of each other. Therefore, the air valve can provide the functions of opening and closing the openings of the body, that is, the user can change the position of the air valve in the body by driving the triggering member, thereby operating the air valve to open and close the openings. The changes of the above mechanism are adapted to the specific functions required by the foldable electronic device.

Further, the foldable electronic device is provided with the centrifugal fan and the heat dissipation fin in the second body therein, and the airflow after absorbing heat is discharged through the lateral opening of the second body. However, as mentioned above, the first body is directly located on the discharge path of the airflow, so the opening of the openings generated by the air valve can allow at least part of the airflow discharged by the second body to pass through the first body through the openings, and to be smoothly discharged from the rear surface of the first body, so as to provide the additional escape path for the airflow. At the same time, the openings are located at the front cover of the first body and are substantially located at the bottom of the display module (in the unfolded state), so the foldable electronic device can take into account the maximum visual screen-to-body ratio and the required heat dissipation efficacy.

What is claimed is:

1. A foldable electronic device, comprising:
   a first body, having a plurality of openings, respectively located at two opposite surfaces of the first body;
   a second body;
   an air valve, movably disposed in the first body;
   at least one triggering member, movably disposed in the first body and having a part exposed outside the first body, wherein the triggering member and the air valve are mutually on moving paths of each other; and
   a hinge, connecting the first body and the second body, so that the first body and the second body are rotated to be folded or unfolded relative to each other by the hinge, and the part of the triggering member is suitable for bearing a force such that the triggering member drives the air valve, so that the air valve opens or closes the openings.

2. The foldable electronic device according to claim 1, wherein each of the triggering member and the air valve has a wedge surface, and the wedge surfaces correspond to each other and are movably abutted together.

3. The foldable electronic device according to claim 1, further comprising: a spring, disposed in the first body and abutting between the air valve and the first body, wherein the spring constantly drives the air valve to close the openings to reset the triggering member, the triggering member is suitable for bearing an external force to open the openings and deform the spring, and when the external force is removed, an elastic force of the spring drives the air valve to close the openings.

4. The foldable electronic device according to claim 1, wherein the first body has a back cover and a front cover assembled with each other, the openings are respectively located at the front cover and the back cover, the openings are communicated with each other through an interior of the first body, and the part of the triggering member is exposed from an edge of the first body from a junction between the front cover and the back cover.

5. The foldable electronic device according to claim 4, further comprising: a display module, assembled at the front cover and the back cover, wherein the display module is stacked on a part of the back cover, the display module and the front cover are located on a same plane, and the front cover is stacked on another part of the back cover.

6. The foldable electronic device according to claim 4, wherein the air valve has a plate body and at least one first stopping portion and at least one second stopping portion located at two opposite surfaces of the plate body, a part of the stopping portions correspond to a part of the openings located at the front cover, the openings comprise at least one first opening located at the front cover and at least one second opening located at the back cover, the first stopping portion corresponds to the first opening, the second stopping portion corresponds to the second opening, when the triggering member bears an external force and moves toward the interior of the first body to drive the air valve to move from the front cover to the back cover, the first stopping portion is embedded into the first body from the first opening to open the first opening, and the second stopping portion protrudes from the first body from the second opening to open the second opening.

7. The foldable electronic device according to claim 6, further comprising: a spring, disposed in the first body and abutting between the plate body and the back cover, wherein the spring constantly drives the plate body to move from the back cover toward the front cover, the triggering member bears the external force to deform the spring, and after the external force is removed, an elastic force of the spring drives the air valve to reset the triggering member, the first stopping portion closes the first opening, and the second stop closes the second opening.

8. The foldable electronic device according to claim 6, wherein the air valve also has two wing portions located at two opposite sides of the plate body, each of the first stopping portion and the second stopping portion is located between the two wing portions, the foldable electronic device comprises a pair of triggering members, and the pair of triggering members and the two wing portions are mutually driven by wedge surfaces abutting against each other.

9. The foldable electronic device according to claim 6, wherein the first stopping portion and the plate body are spaced apart to form at least one first channel, the second stopping portion and the plate body are spaced apart to form at least one second channel, the plate body has at least one third channel, and when the first opening and the second opening are opened, the first opening is communicated with the second opening sequentially through the first channel, the third channel, and the second channel.

10. The foldable electronic device according to claim 4, wherein the triggering member has an expanded hole slidably coupled to a guide post of the back cover.

11. The foldable electronic device according to claim 4, wherein the first body has at least one supporting portion, the supporting portion and the triggering member are both located and both protrude from the edge of the first body, when the air valve closes the openings, a height of the part of the triggering member protruding from the edge is greater than a height of the supporting portion protruding from the edge, and when the air valve opens the openings, a height of the part of the triggering member protruding from the edge is equal to the height of the supporting portion protruding from the edge.

12. The foldable electronic device according to claim 11, wherein the height of the supporting portion protruding from the edge is a fixed value.

13. The foldable electronic device according to claim 4, further comprising: a fan and a heat dissipation fin, disposed in the second body, wherein an airflow generated by the fan passes through the heat dissipation fin and is then discharged out of the second body from at least one lateral outlet of the second body, when the first body is unfolded relative to the second body by the hinge, the first body supports and elevates a part of the second body, and the lateral outlet corresponds to the openings located at the front cover, and when the air valve opens the openings, at least part of the airflow sequentially passes through the openings of the front cover, the air valve, and the openings of the back cover to pass through the first body.

14. The foldable electronic device according to claim 1, wherein when the first body is unfolded relative to the second body by the hinge, the first body supports and elevates a part of the second body, and the triggering member is located at a bottom of the first body.

15. The foldable electronic device according to claim 1, further comprising: a fan and a heat dissipation fin, disposed in the second body, wherein an airflow generated by the fan passes through the heat dissipation fin and is then discharged out of the second body from at least one lateral outlet of the second body, when the first body is unfolded relative to the second body by the hinge, the first body supports and elevates a part of the second body, and the lateral outlet corresponds to a part of the openings, and when the air valve opens the openings, at least part of the airflow passes through the openings to pass through the first body.

16. The foldable electronic device according to claim 1, wherein the part of the triggering member is suitable for bearing a force, so that the triggering member moves toward an interior of the first body to drive different parts of the air valve to respectively protrude and be embedded into the first body to open the openings.

* * * * *